United States Patent
Nanda et al.

(10) Patent No.: US 7,365,667 B1
(45) Date of Patent: Apr. 29, 2008

(54) DELTA-SIGMA ANALOG-TO-DIGITAL CONVERTER (ADC) HAVING AN INTERMITTENT POWER-DOWN STATE BETWEEN CONVERSION CYCLES

(75) Inventors: Kartik Nanda, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/534,191

(22) Filed: Sep. 21, 2006

(51) Int. Cl.
*H03M 3/00* (2006.01)

(52) U.S. Cl. ........................... 341/143; 341/155

(58) Field of Classification Search ......... 341/140–160
See application file for complete search history.

(56) References Cited

U.S. PATENT DOCUMENTS

| | | | |
|---|---|---|---|
| 6,469,650 B2 * | 10/2002 | Nanda et al. ............... | 341/143 |
| 6,738,004 B2 | 5/2004 | Melanson | |
| 7,145,486 B1 * | 12/2006 | Chokhawala et al. ....... | 341/100 |
| 7,193,549 B1 * | 3/2007 | Nanda et al. ............... | 341/144 |
| 7,221,302 B1 * | 5/2007 | Melanson ................... | 341/143 |

OTHER PUBLICATIONS

U.S. Appl. No. 11/297,016, filed Dec. 8, 2005, Melanson et al.
U.S. Appl. No. 11/297,011, filed Dec. 8, 2005, Melanson.
Robert, et al., "A Second-Order High-Resolution Incremental A/D Converter with Offset and Charge Injection Compensation", IEEE JSSC, vol. 23, No. 3, Jun. 1988.
Quinquempoix, et al., "A Low-Power 22-bit Incremental ADC with 4ppm INL, 2ppm Gain Error and 2uV DC Offset", Proceedings of ESSCIRC, Grenoble, FR 2005.
Cirrus 5361 Datasheet, Cirrus Logic Inc., Feb. 2005.

* cited by examiner

*Primary Examiner*—Lam T. Mai
(74) *Attorney, Agent, or Firm*—Andrew M. Harris; Mitch Harris, Atty at Law, LLC (57) ABSTRACT

A delta-sigma analog to digital converter (ADC) having an intermittent power down state between conversion cycles provides for power consumption savings when the converter is in a lower sample rate operating mode. Clocks provided to the digital portions of the converter are disabled, except for a periodic interval in which a conversion is performed at the higher selectable sample rate of the converter. The analog portions of the converter can also be disabled, but are re-enabled for a predetermined time period and reset before the digital clocks are enabled, so that the loop filter and feedback value supplied from the quantizer to the loop filter are stable prior to each conversion.

22 Claims, 4 Drawing Sheets

Fig. 4C

DELTA-SIGMA ANALOG-TO-DIGITAL CONVERTER (ADC) HAVING AN INTERMITTENT POWER-DOWN STATE BETWEEN CONVERSION CYCLES

CROSS-REFERENCE TO RELATED APPLICATIONS

The present application is related to co-pending U.S. patent application Ser. No. 11/534,195, entitled "DELTA-SIGMA MODULATOR HAVING QUANTIZER CODE PATTERN DETECTION CONTROLLED DITHER" filed concurrently herewith, issued as U.S. Pat. No. 7,317,411 on Jan. 8, 2008, having at least one common inventor, and assigned to the same assignee. The above-referenced U.S. patent Application is incorporated herein by reference.

BACKGROUND OF THE INVENTION

1. Field of the Invention

The present invention relates generally to analog-to-digital converters, and more specifically, to a delta-sigma analog-to-digital converter that partially powers-down between conversion cycles for lower sample rates.

2. Background of the Invention

Delta-sigma modulators are in widespread use in analog-to-digital converters (ADCs) and digital-to-analog converters (DACs), in which they provide very linear behavior and simple implementation due to the reduced number of bits used in the analog signal comparison. Delta-sigma modulators can be implemented with a high level of control of the frequency distribution of "quantization noise", which is the difference between the ideal output value of the modulator as determined by the input signal and the actual output of the modulator provided by a quantizer. The relative simplicity of the architecture and the ability to finely control the quantization noise makes delta-sigma converter implementations very desirable.

The delta-sigma modulator based ADC typically includes an analog loop filter that receives an input signal and a quantizer that converts the analog output of the loop filter to a digital representation. A feedback signal provided from the output of the quantizer is introduced to the analog loop filter to close the loop such that the average output of the quantizer is equal to the value of the input signal. The output of the quantizer is then filtered by a low-pass digital filter having a large number of taps, in order to provide an accurate conversion result from the quantizer output, which typically includes hundreds of values per conversion cycle.

Since the operation of the delta-sigma modulator based ADC as described above is a quasi-continuous process within both the loop filter and the digital low-pass filter at the output, delta-sigma modulator based ADCs are typically designed for a fixed sample rate, or a sample rate that is selectable over a small range. The ADCs are typically operated continuously, unlike so-called "flash" ADCs or successive-approximation ADCs, which can be used to acquire a single sample and then be shut down between sampling/conversion cycles in order to save power at lower sampling rates. Interrupting the operation of the converter in order to save power between samples will cause disruption of the operation of the analog loop filter.

When multiple sample rates are supported by a delta-sigma ADC, the digital low-pass filter that renders the converter output is typically scaled by changing its clock frequency and the clock rate of the modulator is also changed. Therefore, in order to support widely varying sample rates in an ADC integrated circuit using a delta-sigma modulator, the power required for operating analog portion of the converter will be that required to support the higher clock rate in the modulator. Also, the digital low-pass filter that provides the output of the converter is also typically changed when a different sample rate is selected, so that the proper stop-band performance is attained at the lower sampling rate.

Therefore, it would be desirable to provide a delta-sigma ADC that can be placed at least partly in a power-saving mode between conversions when a lower sample rate is selected.

SUMMARY OF THE INVENTION

The above stated objective of providing a delta-sigma ADC that can be placed in power-savings mode between conversions when a lower sample rate is selected is realized in an analog-to-digital converter circuit and its method of operation.

The ADC includes a loop filter that provides an output to a quantizer input. The output of the quantizer is provided to a digital low-pass filter that provides the output of the ADC and is also provided to a DAC that generates a feedback signal provided to the loop filter to close the modulator loop. When placed in a selectable lower sampling rate operating mode, the clocks supplied to the digital portions of the ADC, including the quantizer, are disabled, except for a periodic interval corresponding to the time required to perform a conversion at the higher selectable sample rate of the converter.

The analog portions of the converter can also be disabled, but are re-enabled for a predetermined time period before the digital clocks are enabled and the analog loop filter reset, so that the loop filter and feedback value supplied from the quantizer to the loop filter are stable prior to each conversion.

The digital low-pass filter may be a half-filter, with a peak time-domain window function coefficient at the beginning of the response, or otherwise implemented such that the earlier half of the time-domain window function has a greater amplitude than the later half. The digital low-pass filter may also be selectable between the half filter response and a symmetric response, and selection may be made in conformity with the sample rate selection, so that the half-filter response is only selected when the lower sample rate is selected.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and apparatus for reducing power consumption in a delta-sigma modulator based analog-to-digital converter (ADC) that supports substantially differing selectable sample rates. Rather than changing the clock rate of the modulator in proportion to the sample rate, in the converter of the present invention, the modulator is operated at full frequency. The modulator is then shut down between conversions, if a lower sample rate is selected, providing a reduction in power consumption of the converter by operating in an "intermittent" mode. The digital low-pass filter that provides the output of the ADC may also be operated at the full clock rate and then shut down when a conversion is complete.

Since the modulator is reset between conversions in the intermittent mode, the output digital low-pass filter may be implemented as a half-filter having a time-domain window function peak substantially near the beginning of the conversion, rather than near the center since one of the features of the present invention is that the modulator starts operation at a predetermined state when the converter is operated at the lower sampling rate. The modulator may also be reset between conversion cycles in the continuous operating mode, and if so, the half-filter may be used in the continuous mode, as well.

Figure 1:
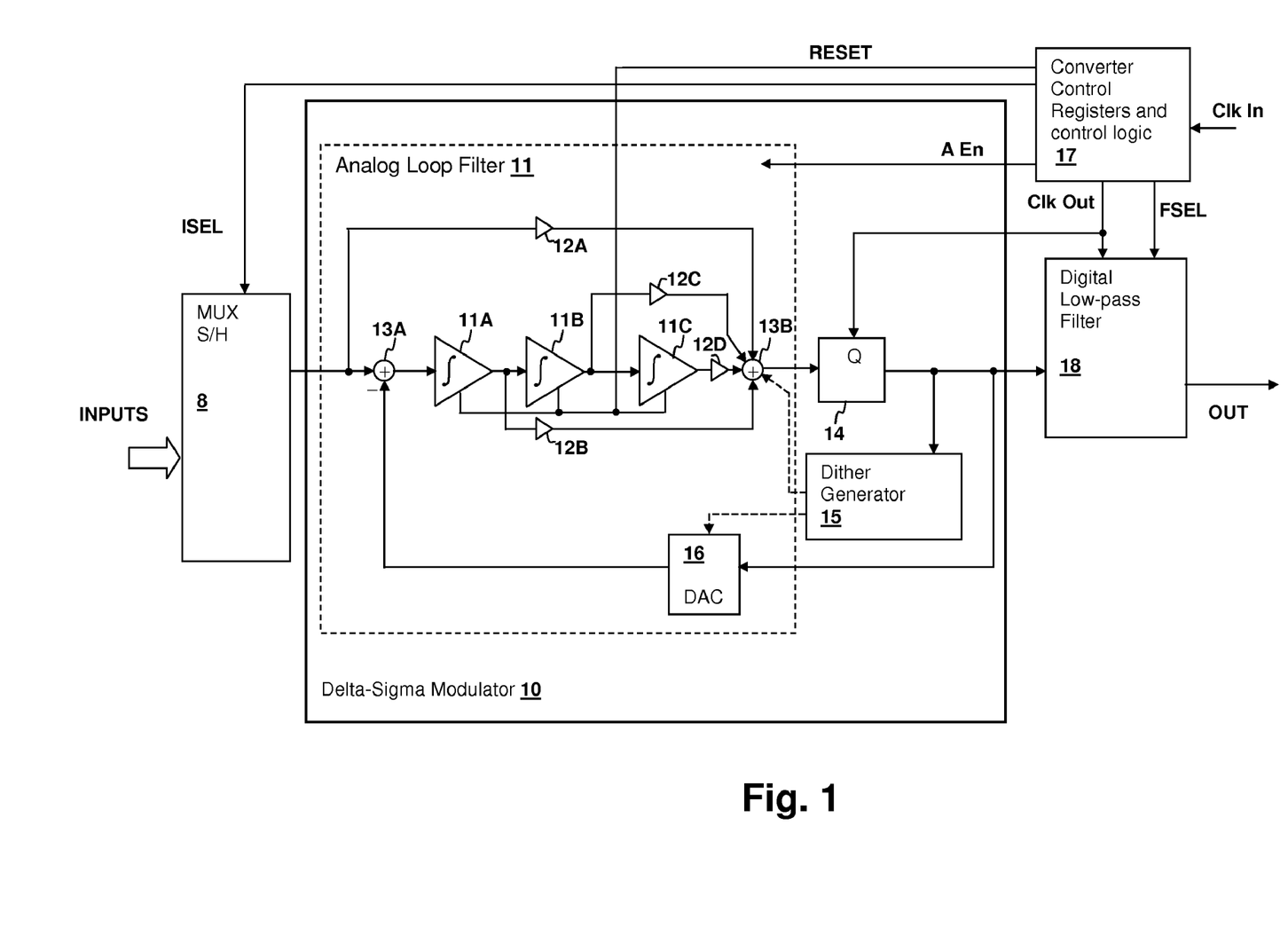
FIG. 1 is a block diagram depicting an ADC in accordance with an embodiment of the present invention.

Referring now to FIG. 1, an ADC converter circuit in accordance with an embodiment of the present invention is shown. A multiplexing sample/hold circuit 8 selects one of multiple input signals INPUTS that are provided to a delta-sigma modulator 10. Delta-sigma modulator 10 provides a digital output containing quantization noise and having a time-average value representing the input signal selected by multiplexing sample/hold circuit 8. A digital low pass filter provides a digital output OUT of the ADC by filtering the output of delta-sigma modulator 10. Converter control registers and logic 17 supplies clock signals to a digital low pass filter 18 and a quantizer 14 of delta-sigma modulator 10, and in discrete-time implementations of an analog loop filter 11 of delta-sigma modulator 10, provides the clocks to other portions of delta-sigma modulator 10.

Analog loop filter 11 is a feed-forward third-order loop filter design, which may be a continuous-time analog filter or may be a switched-capacitor filter. There are advantages to implementing analog loop filter 11 as a discrete-time circuit as will be pointed out in further detail below. However, it is understood that with appropriate additional isolation switching elements, analog loop filter 11 of the ADC circuit of the present invention may be implemented as a continuous-time analog filter. A series of cascaded integrators 11A-11C receive at a first integrator stage 11A, a signal representing the difference between the input signal selected by multiplexing sample/hold circuit 8 and a feedback signal provided by a digital-to-analog converter (DAC) 16 that converts the output of quantizer 14 to an analog signal. The output of quantizer 14 is also supplied to digital low-pass filter 18, which attenuates the quantization noise introduced by delta-sigma modulator 10.

A set of feed-forward signal paths are provided through scalers 12A-12D and are summed by a summer 13B that provides an analog input to quantizer 14. When a clock signal is applied to quantizer 14, the feedback signal provided by DAC 16 closes the loop around delta-sigma modulator 10, enforcing the condition that the time-average output of quantizer represents the selected input signal. A dither generator 15 provides a dither signal to quantizer 14 and receives a signal from a dither generator 15. Dither generator 15 increases the amplitude of the dither applied to summer 13B (or alternatively to an input of DAC 16) if a repetitive sequence of codes indicates that the feedback value and the input signal are equal or close to equal in value and therefore are reducing the noise-shaping action of the modulator by not changing the output of quantizer 14.

In the present invention, when the sample rate of the converter is at a maximum, the converter operates at least substantially continuously as described above, providing a digital output at the end of each conversion cycle that represents the analog input signal selected by multiplexing sample/hold circuit 8. Delta-sigma modulator 10 also may or may not be reset after each conversion. However, for sample rates substantially lower than the maximum sample rate, the converter of the present invention can be operated intermittently and portions of the converter powered-down and reset prior-to performing another conversion, so that the power consumption of the converter can be reduced for lower sample rates, just as in non-delta-sigma converters. The present invention makes it practical to design a single ADC to support a wide range of sample rates and still achieve desired power consumption performance for lower sample rates. For prior art designs, the power consumed by the analog circuits must typically be the same for higher sample rates and lower sample rates, as the analog loop filter must have the slew rate performance required at the highest sample rate.

Converter control registers and logic 17 controls the clock signals and power supply distribution to delta-sigma modulator, as well as to digital low-pass filter 18, so that either automatically when a lower sample rate is selected, or by register manipulation of bits within converter control registers and logic 17 in conjunction with a sample rate change, several operating changes are made for the lower sample rate. Clock signal Clk Out is changed from a continuous clock for the higher sample rate, to a burst clock at the lower sample rate, where the burst contains the same number of clocks at the lower sample rate that are required for a conversion cycle at the higher sample rate. Therefore, the duty factor of the burst is the ratio of the lower sample rate to the higher sample rate. For example, a converter supporting selectable operation at both 50 kHz and 5 kHz and having an over-sampling ratio of 256, would have a continuous Clk Out signal of 12.8 MHz when the 50 kHz sampling rate is selected and a 20 µS long burst of 256 clocks of frequency 12.8 MHz at intervals of 200 µS when the 5 kHz sampling rate is selected.

Between the clock bursts, which operate modulator at 12.8 Mhz even for the lower sampling rate, converter control registers and logic 17 disable the analog power supplies to analog loop filter 11 by disabling an analog circuit enable signal A En provided to analog loop filter 11. Analog circuit enable signal A En is re-enabled several modulator clock cycles, for example 10 clock cycles, so that integrators 11A-11C, summers 13A, 13B scalers 12A-12D and DAC 16 have stable outputs prior to re-applying clocks to quantizer 14, i.e., before the start of the next clock burst. The clock signal supplied to digital low-pass filter may also be halted after filtering of the conversion data provided during the clock burst is complete. A RESET signal is also supplied to analog loop filter 11, which causes integrators 11A-11C to be held in a reset state until the conversion is started. As pointed out above, the RESET signal may also be applied between conversions during continuous operation.

Additionally, converter control registers and logic 17 may either automatically when a lower sample rate is selected, or by register manipulation of bits within converter control registers and logic 17 in conjunction with a sample rate change, change the operation of digital low-pass filter 18 from that of a traditional symmetrical time-domain window function, to that of a half-filter response that starts at the peak value of the impulse response with the first sample and then decays to a substantially zero value. Because the burst operation and RESET signal described above enforce a known state in the modulator at the beginning of each conversion cycle for the lower sample rate, a half-filter response can be used for the digital low-pass filter 18. The half-filter response provides substantially the same result that would be had from a traditional filter response that receives twice the number of modulator samples. Since the number of modulator samples per conversion cycle is constant when the lower sample rate is selected, e.g. 256, per conversion cycle in the example given above, using the half filter gives substantially the same performance as if the number of samples has been doubled, with the modulator still interrupted every 100 μS. If delta-sigma modulator 10 is reset in continuous mode operation, the same advantages can be had from the application of the half-filter.

The present invention also provides the ability to easily multiplex at lower sample rates, which is not present for converters employing continuously-operating modulators. At the maximum sample rate in the present invention, and for continuous modulator converters at any sample rate, if a new input of multiplexing sample/hold circuit 8 is selected, a conversion must be discarded due to the charge-injection involved in changing the multiplexing sample/hold circuit switch and the fact that delta-sigma modulator 10 is continuously running during the settling of the input signal as applied to the internal sample/hold of multiplexing sample/hold circuit 8, i.e., the transient generated by the switching of multiplexing sample/hold circuit 8 will be reflected in the output of quantizer 14 for the conversion in which the input selection is changed. In the lower sampling rate operation of converters in accordance with embodiments of the present invention, the input selected by multiplexing sample/hold circuit 8 may be changed at any point between the clock bursts that is sufficiently ahead of the time required to stabilize the analog loop filter, for example, the input can be changed at the time when the analog circuits are re-enabled. Further, if delta-sigma modulator is reset in continuous mode operation, multiplexing sample/hold circuit 8 can be switched during that interval without disrupting operation.

In order to assure accurate operation when the converter is re-started at the lower sample rate, dither generator 15 includes a pattern matching circuit. When a code sequence from quantizer 14 indicates that the feedback value and the input signal value are close in value, e.g., when a sequence of constant values is produced by quantizer 14, the amplitude of the dither signal generated by dither generator 15 is increased until the output of quantizer 14 changes. After the change is detected, the output of dither generator 15 is restored to the nominal value. Generally, in order to obtain the maximum possible accuracy, it is desirable to under-dither the quantizer, in order to provide the maximum possible dynamic range from the converter without instability in the modulator. However, when the input signal and the feedback value are the same or close in value, the quantizer output will not change, or will not change for a significant number of quantizer output values.

During the intermittent lower-sample rate conversion of the present invention, at the beginning of modulator operation, the output of summer 13A starts at zero due to the resetting of the modulator prior to the clock signal burst, and therefore such long sequences of repeated code values are more frequent for low input signal values. Therefore, dither generator 15 or some other mechanism is needed to ensure that the quantizer does not produce long sequences of a single value during startup of the modulator. For that purpose, dither generator 15 is designed to detect the code(s) that indicate that the modulator loop is producing an unchanging sequence of quantizer output code values indicating that the quantizer is "stuck" at a particular quantization level, and an output signal that causes dither generator 15 to scale its output is provided. The extreme values (maximum and minimum outputs) of quantizer 14 are excluded from the unchanging code sequence detection, so that delta-sigma modulator 10 is not further de-stabilized by the addition of dither when delta-sigma modulator 10 is already operating in a potentially unstable condition indicated by the output of quantizer 14 assuming an extreme value.

Figure 2:
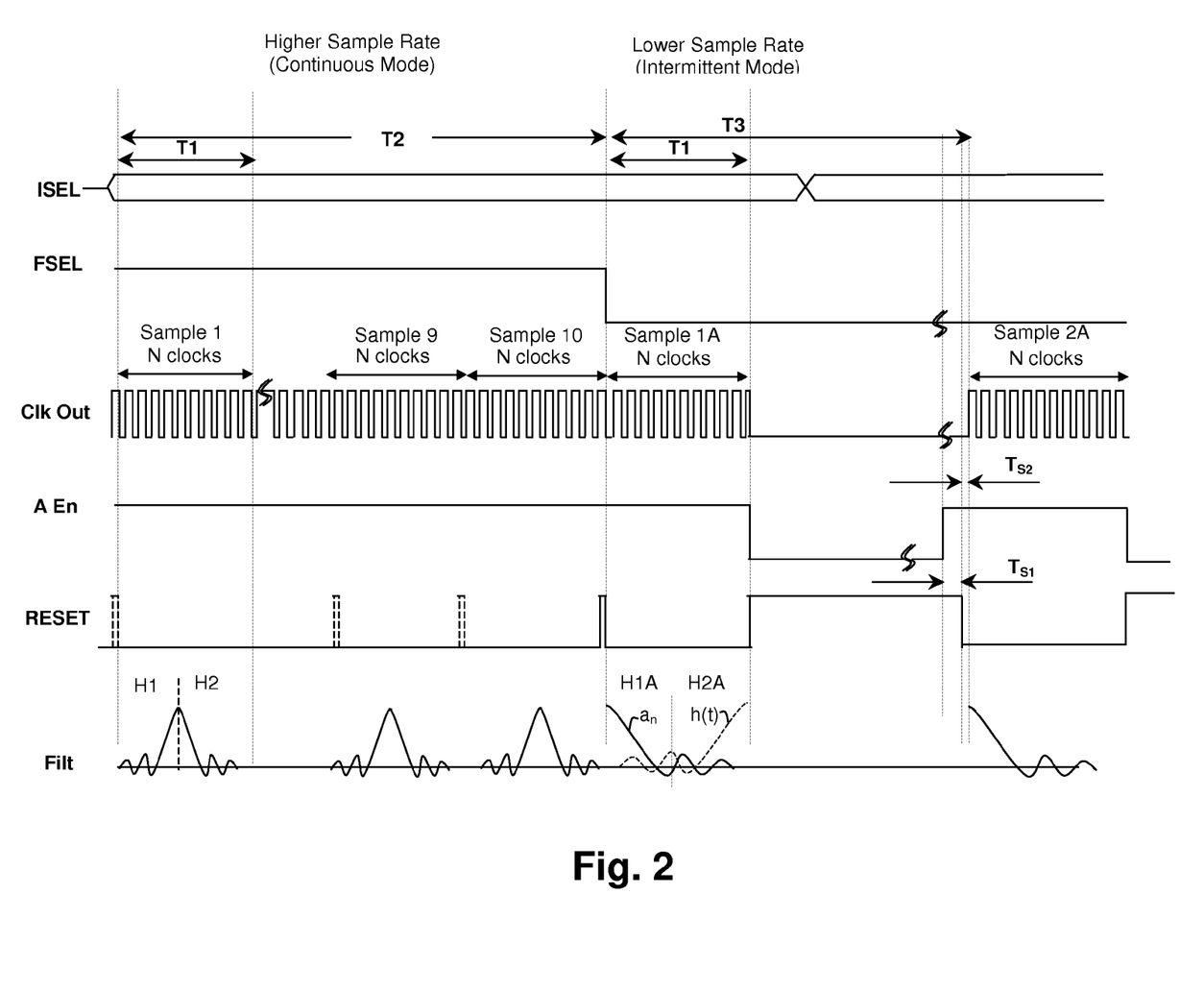
FIG. 2 is a signal timing diagram depicting signal relationships within the circuit of FIG. 1.

Referring now to FIG. 2, an exemplary set of signals within the circuit of FIG. 1 are shown in time and voltage relationship with each other, to further demonstrate the operation of the present invention. The clock output signal Clk Out is used to represent a single clock that operates the various digital portions of the ADC circuit of FIG. 1. However, it is understood that the actual clocks used to operate the various blocks may constitute several clocks and the clocks may be of differing frequency. For example, the output digital low-pass filter 18 might be operated at a lower clock frequency than quantizer 14, with a decimation-by-two block provided between the output of quantizer 14 and digital low-pass filter 18. Further, the clock bursts that intermittently operate quantizer 14 and digital low-pass filter 18 will generally be offset by at least one-half clock period so that valid output values of quantizer 14 are latched and subsequently operated on in digital low-pass filter 18.

The left-most portion of the signal diagram of FIG. 2, displays operation in a continuous mode corresponding to the maximum sample rate of the converter. Clock signal Clk Out is provided continuously, and the time periods indicated as T1 and T2 correspond to one conversion cycle and ten conversion cycles, respectively, in the left-most portion of the diagram. The right-most portion of the diagram depicts operation in the intermittent mode of the lower sample rate, where time period T1 is again the time to perform one conversion cycle, and time period T3 is the time between conversion cycles, which for the example given of a 10:1 ratio between higher and lower sample rates is equal to T2. Signal ISEL illustrates selection of an input signal by multiplexing sample/hold circuit 8, which for valid consecutive conversion cycles in the continuous mode on the left half of the diagram, must be made before those conversion cycles as shown, but for the intermittent mode shown in the right half of FIG. 2, can be made during the interval between conversion cycles.

Signal A En is the signal that enables the analog circuits in analog loop filter 11 and is shown as continuously enabled during continuous operation, and enabled at a time $T_{S1}+T_{S2}$ prior to the start of the clock burst of clock signal Clk Out. Signal RESET is de-asserted at time $T_{S2}$ prior to the start of the burst of clock signal Clk Out to enable switch S1 and as depicted may also be present during continuous mode operation and is also asserted prior to the first conversion cycle in intermittent mode. Finally, waveform Filt is representative of the coefficients of the time-domain window function of digital low-pass filter 18, which is shown in normal filter mode in continuous mode operation on the left side of the diagram, and in half-filter mode during intermittent operation. The impulse response h(t) shown in dashed lines is provided by multiplying the sequence of quantizer 14 output values corresponding to each modulator clock of the clock signal Clk Out burst with the coefficients of the window function shown as $a_n$.

The half-filter mode differs from the normal mode of digital low-pass filter 18, as illustrated by the asymmetric response shown with first half H1A having the peak coefficient placed at or near the first modulator sample (indicated by the first clock pulse of the clock burst of signal Clk Out) and generally decreasing amplitude to the end of the clock burst, with a lower energy during half-interval H2A compared to half-interval H1A. The normal response shown in the left half of the signal diagram has response halves H1 and H2 that are mirror images of each other. However, as noted above, if delta-sigma modulator 10 is reset between conversions in continuous mode, the half-filter response may also be used for those conversions.

Figure 3:
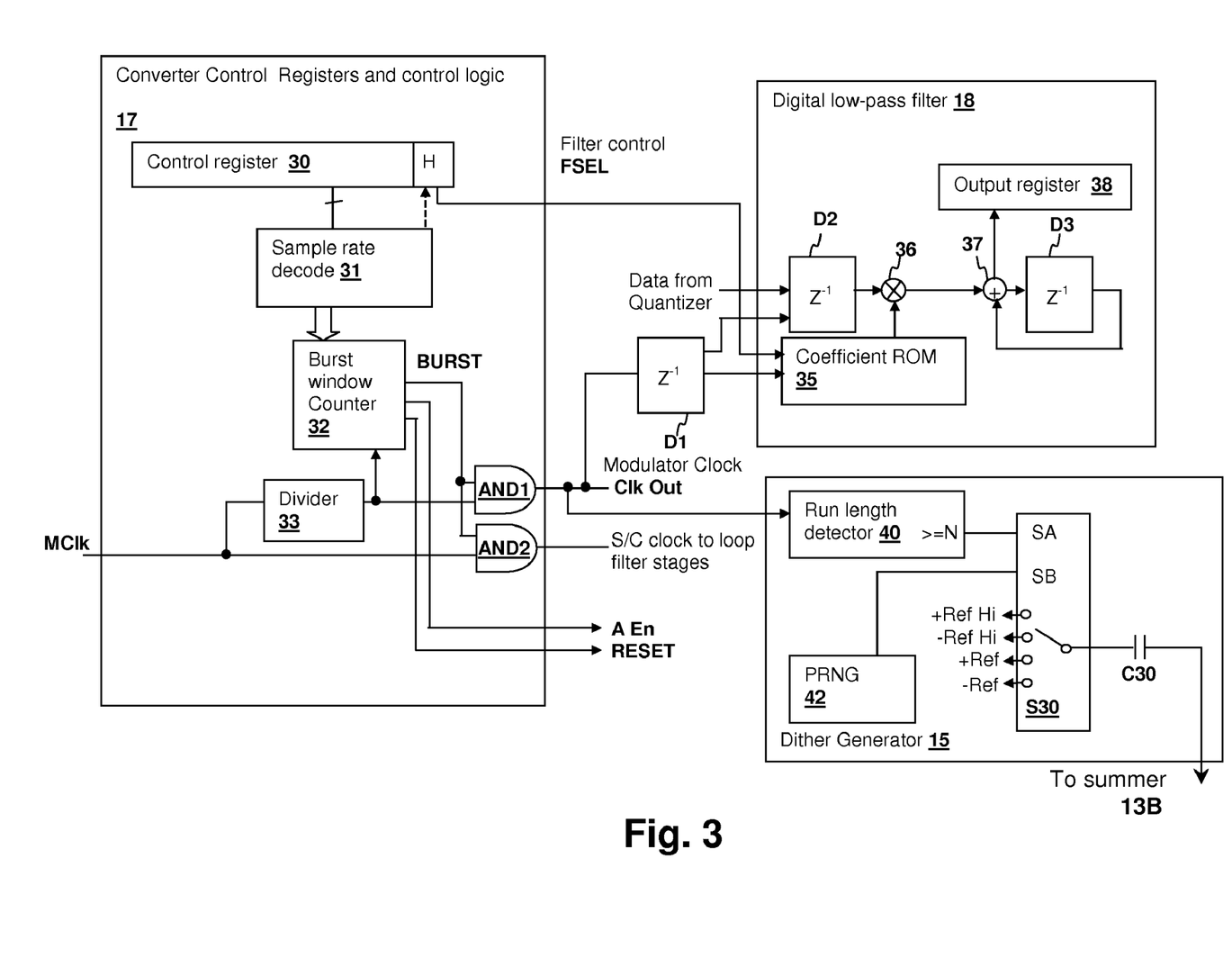
FIG. 3 is a block diagram depicting the structure of converter control registers and control logic 17, digital low-pass filter 18, and dither generator 15 of FIG. 1.

Referring now to FIG. 3, details of converter control registers and control logic 17 and digital low-pass filter 18 of FIG. 1 are shown. Within converter control registers and control logic 17, a control register 30 receives at least a sample rate selection value and an optional bit H for controlling the mode of digital low-pass filter 18. Bit H may be set automatically in response to a decode of the sample rate provided by sample rate decoder 31 to a burst window counter 32, so that the half-filter mode described above is automatically engaged when the lower (intermittent mode) sample rate is selected. Burst window counter 32 receives a clock input from a divider 33 that scales the master clock signal MClk to the operating frequency of the modulator. A logical AND gate AND1 provides a burst of clock pulses at the rate of the output of divider 33 to the modulator as the Clk Out signal and logical AND gate AND2 provides a burst of clock pulses at the rate of master clock signal MClk to operate switched-capacitor integrators in analog loop filter 11 of FIG. 1. If continuous-mode integrators are employed, divider 33 is not used, and master clock signal MClk can be provided at the modulator clock rate.

Burst window counter 32 also provides the A En signal and RESET signals from decodes of the internal count, so that the A En signal is activated several counts prior to the BURST signal being asserted, and the RESET signal is de-asserted after the A En signal is activated and just prior to the BURST signal being asserted. When the higher sample rate (continuous mode) is selected and detected by sample rate decoder 31, burst window counter 32 asserts the BURST signal continuously to enable logical AND gates AND1 and AND2, and also continuously asserts the A En signal and de-asserts the RESET signal, to provide continuous operation of the modulator 10 of FIG. 1.

A unit clock delay D1 delays the modulator clock to clock the values at the output of delta-sigma modulator 10 into latch D2, and also to clock coefficients from coefficient ROM 35. The output of coefficient ROM 35 and the output of latch D2 are multiplied by a multiplier 36 and summed by an adder 37 with accumulated previous addition results of adder 37 that are stored in latch D3. The H bit is provided to coefficient ROM 35 to select between coefficients of the half-filter or full filter response as described above. An output register 38 provides for latching the resultant accumulation of the products of the coefficients and the output values from delta-sigma modulator 10, resulting in the convolution that yields the low-pass filter output.

Details of dither generator 15 are also shown in FIG. 3. A run-length detector 40 provides an >=N output indicating that the last N codes have the same value. For example, for N=11, if 11 codes are received that all have the same value, the >=N output signal of run-length detector 40 is asserted. As mentioned above, run-length detector 40 is designed to ignore long runs of the extreme maximum or minimum codes, so that the >=N output is not activated if quantizer 14 is saturated. A pseudo-random number generator (PRNG) 42 provides a control output that operates the select SA of a multiplexer switch S30 that when the output of run length detector is low, alternates the polarity of a reference voltage (+Ref, −Ref) applied to capacitor C30. The output of run length detector 40 controls the select SB input of multiplexer switch S30 so that when a long run (e.g., 11 codes) of the same value are detected, the dither voltage is increased by alternating between another set of reference voltages (+Ref Hi, −Ref Hi). Exemplary values of dither correspond to +/−0.22 of a quantizer step for the normal dither level and a full quantizer step under unchanging quantizer output code conditions.

Figure 4A:
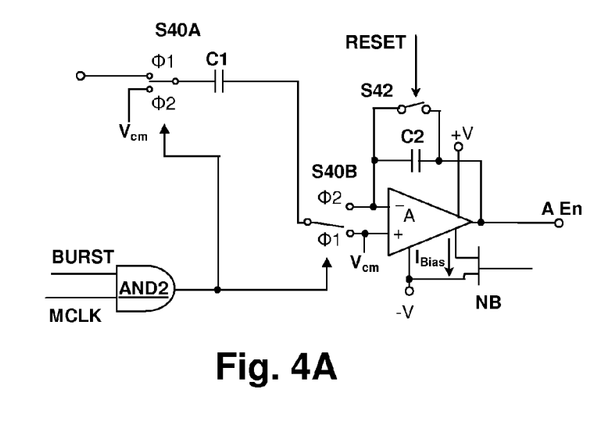
FIGS. 4A-4D are circuit diagrams of integrator stages that may be employed in an ADC in accordance with an embodiment of the present invention.

Referring now to FIG. 4A, a switched-capacitor integrator stage that may be used to implement integrators 11A-11C of FIG. 1 is depicted. Although a single-ended switched-capacitor integrator is shown for simplicity, a fully differential switched-capacitor integrator stage is generally used in the converter. Switches S40A and S40B apply capacitor C1 alternatively to the input node of the stage and to the summing node of amplifier A, thus producing operation as a resistance. Feedback capacitor C2 in combination with the input resistance yields an integrator. Logical AND gate AND2 is shown as controlling the burst of pulses applied to switches S40A and S40B in the intermittent conversion mode, which will be a continuous MClk signal in the continuous conversion mode. Analog circuit enable signal A En is supplied to the gate of transistor NB, which controls the bias current levels $I_{Bias}$ in amplifier A. Amplifier A acts as an integrator as described above, and is reset by switch S42 in response to the RESET signal.

Figure 4B:
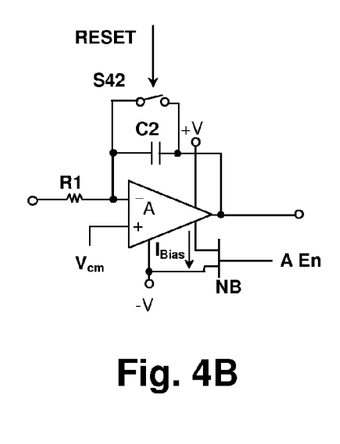

Referring now to FIG. 4B, a continuous time integrator that may be used as an alternative to the discrete-time circuit of FIG. 4A is shown. Only differences between circuits of FIGS. 4A and 4B will be described below. Rather than including a switched-capacitor input circuit, a resistor R1 is employed. Since capacitor C2 is held in a discharge state when the RESET signal is asserted, no additional modification to the circuit is necessary to reset the state of the integrator. However, in intermittent operating mode, the RESET signal in the circuit of FIG. 4B must be controlled such that it is released just as the conversion cycle is beginning in order to avoid drift, whereas in the circuit of FIG. 4A, integration of the applied input signal does not commence until the BURST signal is asserted.

Figure 4C:
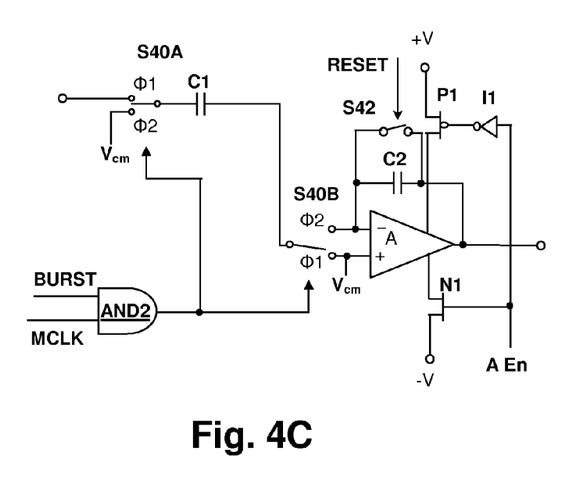

Referring now to FIG. 4C, an alternative method and apparatus for controlling the power consumption of amplifier A in the switched-capacitor integrator of FIG. 4A is illustrated. Rather than controlling the bias current of amplifier A, analog circuit enable signal A En is supplied to the gate of transistor N1 and an inverter I1 supplies an inverted version of signal A En to transistor P1, which controls the application of the analog power supplies to amplifier A, thus disabling the integrator.

Figure 4D:
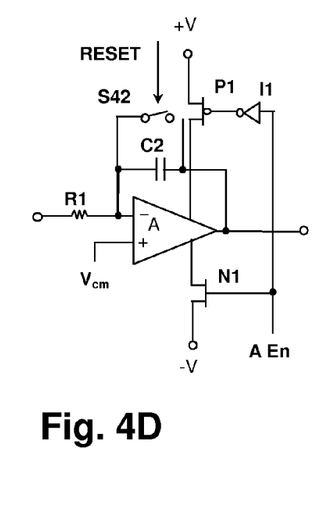

Referring now to FIG. 4D, an alternative method and apparatus for controlling the power consumption of amplifier A in the continuous-time integrator of FIG. 4B is illustrated. As in the circuit of FIG. 4C, analog circuit enable signal A En is supplied to the gate of transistor N1 and an inverter I1 supplies an inverted version of signal A En to transistor P1, which controls the application of the analog power supplies to amplifier A, thus disabling the integrator.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. An analog-to-digital converter circuit, comprising:
   an analog loop filter;
   a quantizer having an input coupled to an output of said analog loop filter;
   a digital low-pass filter having an input coupled to an output of said quantizer and an output for providing an output of said analog-to-digital converter circuit;
   sample rate selection logic for receiving a selection corresponding to one of a higher sample rate and a lower sample rate of said output of said analog-to-digital converter; and
   control logic, coupled to said sample rate selection logic, wherein in response to selection of said higher sample rate, provides substantially continuous clock signals at a sampling clock rate to said quantizer, and wherein in response to selection of said lower sample rate, provides periodic bursts of said clock signals at said sampling clock rate to said quantizer and resets said analog loop filter prior to each of said periodic bursts, whereby power consumption of said analog-to-digital converter is reduced when said lower sample rate is selected.

2. The analog-to-digital converter of claim 1, wherein said control logic further provides said periodic bursts of said clock signals to said digital low-pass filter when said lower sample rate is selected, whereby said power consumption is further reduced.

3. The analog-to-digital converter of claim 1, wherein said loop filter further includes a power control circuit for disabling amplifiers of said loop filter, wherein said power control circuit is coupled to said control logic, and wherein when said lower sample rate is selected, said control logic enables said amplifiers for a predetermined period of time prior to providing each of said periodic bursts of clock signals to said quantizer and disables said amplifiers subsequent to completion of each of said periodic bursts of clock signals.

4. The analog-to-digital converter of claim 3, wherein when said higher sample rate is selected, said power control circuit does not disable said amplifiers.

5. The analog-to-digital converter of claim 3, wherein said power control circuit controls bias current levels in said amplifiers.

6. The analog-to-digital converter of claim 3, wherein said power control circuit controls whether at least one power supply voltage is supplied to said amplifiers.

7. The analog-to-digital converter of claim 1, wherein said digital low-pass filter has a time-domain window function such that an average value of an earlier half said time-domain window function is substantially greater than that of an average value of a later half of said time-domain window function.

8. The analog-to-digital converter of claim 7, wherein said digital low-pass filter has a time-domain window function such that an initial coefficient of said time-domain window function is greater any subsequent coefficient of said time-domain window function.

9. The analog-to-digital converter of claim 7, wherein said digital low pass filter has a selectable time-domain window function wherein in a first filter mode, an earlier half said time-domain window function is substantially greater than that of an average value of a later half of said time-domain window function, and wherein in a second filter mode, said time-domain window function is substantially symmetrical with respect to time.

10. The analog-to-digital converter of claim 9, wherein said digital low-pass filter is coupled to said sample rate selection logic for selecting said first filter mode when said lower sample rate is selected and selecting said second filter mode when said higher sample rate is selected.

11. The analog-to-digital converter of claim 1, wherein said analog loop filter includes a control input for resetting integrators of said loop filter, and wherein said control logic enables an output of said analog loop filter and said quantizer prior to removing a reset signal from said integrators, whereby a feedback signal provided to said loop filter from said quantizer is stabilized prior to said control logic providing each of said periodic clock bursts.

12. An analog-to-digital converter circuit, comprising:
   an analog loop filter;
   a quantizer having an input coupled to an output of said analog loop filter;
   a digital low-pass filter having an input coupled to an output of said quantizer and an output for providing an output of said analog-to-digital converter circuit, wherein said digital low-pass filter has a time-domain window function such that an average value of an earlier half said time-domain window function is substantially greater than that of an average value of a later half of said time-domain window function; and
   a control logic for resetting said analog loop filter prior to beginning application of said time-domain window function by said digital low-pass filter.

13. The analog-to-digital converter of claim 12, wherein said digital low-pass filter has a time-domain window function such that an initial coefficient of said time-domain window function is greater than any subsequent coefficient of said time-domain window function.

14. A method of operating an analog-to-digital converter, comprising:
   receiving a selection indicator that indicates whether said analog-to-digital converter is selected for operation in a discontinuous mode;
   filtering an input and feedback signals with an analog loop filter;
   quantizing a result of said filtering to provide an output signal, wherein said quantizing introduces quantization noise to said output signal;
   responsive to said analog-to-digital converter being selected for operation in said discontinuous mode, disabling analog circuits of said analog-to-digital converter and halting said quantizing for a predetermined period;
   counting said predetermined period internal to said analog-to-digital converter;
   re-enabling said analog circuits and resuming said quantizing in response to completing said counting; and
   resetting said analog loop filter prior to said re-enabling.

15. The method of claim 14, wherein said disabling said analog circuits is performed by controlling a bias current level of amplifiers within said analog circuits.

16. The method of claim 14, further comprising:
   receiving an indication of selection of a sample rate of said analog-to-digital converter; and setting said selection indicator that indicates whether said analog-to-digital converter is selected for operation in a discontinuous mode in conformity with said sample rate.

17. The method of claim 14, further comprising:

holding integrators of said analog loop filter in a reset state in response to said disabling power; and removing said reset state from said integrators so that operation of said analog loop filter can resume a predetermined period of time after re-enabling power to said analog circuits.

18. The method of claim 14, further comprising filtering a result of said quantizing by convolving a result of said quantization with a time-domain window function, wherein an average value of an earlier half said time-domain window function is substantially greater than that of an average value of a later half of said time-domain window function.

19. A method of operating an analog-to-digital converter, comprising:

filtering an input and feedback signals with an analog loop filter;

quantizing a result of said filtering to provide an output signal, wherein said quantizing introduces quantization noise to said output signal;

integrating a result of said quantizing with a digital integrator;

providing a feedback signal proportional to a result of said integrating to said filtering, whereby said loop filter frequency-shapes said quantization noise to move said quantization noise to a frequency band outside of a frequency band of said input signal of said analog-to-digital converter;

attenuating said quantization noise with a digital low-pass filter by convolving a result of said quantization with a time-domain window function, wherein an average value of an earlier half said time-domain window function is substantially greater than that of an average value of a later half of said time-domain window function; and resetting said integrating prior to said convolving.

20. The method of claim 19, wherein said convolving is performed with a time-domain window function such that an initial coefficient of said time-domain window function is greater any subsequent coefficient of said time-domain window function.

21. An analog-to-digital converter circuit, comprising:

an input for receiving an analog signal;

a conversion circuit for providing a digital output representing said analog signal; and a control logic for receiving a sample rate selection indication, wherein in response to selection of a lower sample rate, provides for automatic periodic operation of said conversion circuit, and wherein in response to selection of a higher sample rate provides for continuous operation of said conversion circuit.

22. The analog-to-digital converter circuit of claim 21, wherein said conversion circuit comprises an analog loop filter;

a quantizer having an input coupled to an output of said analog loop filter; and a digital low-pass filter having an input coupled to an output of said quantizer and an output for providing an output of said analog-to-digital converter circuit.

* * * * *